United States Patent
Lee et al.

(10) Patent No.: US 8,295,414 B2
(45) Date of Patent: Oct. 23, 2012

(54) DEVICE FOR GAIN CONTROL AND METHOD FOR RECEIVING SIGNAL

(75) Inventors: Hoon Lee, Daejeon (KR); Young Jo Bang, Daejeon (KR); Seungjae Bahng, Daejeon (KR); Youn Ok Park, Daejeon (KR)

(73) Assignees: Samsung Electronics Co., Ltd., Suwon-si (KR); Electronics and Telecommunications Research Institute, Daejeon (KR)

( * ) Notice: Subject to any disclaimer, the term of this patent is extended or adjusted under 35 U.S.C. 154(b) by 463 days.

(21) Appl. No.: 12/510,120

(22) Filed: Jul. 27, 2009

(65) Prior Publication Data
US 2010/0142661 A1 Jun. 10, 2010

(30) Foreign Application Priority Data
Dec. 4, 2008 (KR) .................. 10-2008-0122731
Mar. 25, 2009 (KR) .................. 10-2009-0025586

(51) Int. Cl.
*H04L 27/08* (2006.01)
(52) U.S. Cl. ........ 375/345; 375/260; 375/350; 341/114; 341/155; 455/63.1; 455/1
(58) Field of Classification Search .................. 375/345, 375/260, 350; 341/114, 155; 455/63.1, 234, 455/1
See application file for complete search history.

(56) References Cited

U.S. PATENT DOCUMENTS

| | | | | |
|---|---|---|---|---|
| 5,973,560 | A * | 10/1999 | Lee ............................... | 330/136 |
| 7,792,204 | B2 | 9/2010 | Shin et al. | |
| 7,822,153 | B2 | 10/2010 | Song et al. | |
| 2008/0031387 | A1 * | 2/2008 | Shin et al. ...................... | 375/345 |
| 2009/0163167 | A1 | 6/2009 | Hillery et al. | |

FOREIGN PATENT DOCUMENTS

| | | |
|---|---|---|
| KR | 10-2006-0090379 A | 8/2006 |
| KR | 10-2007-0081381 A | 8/2007 |
| KR | 10-2008-0012416 A | 2/2008 |

* cited by examiner

*Primary Examiner* — Zewdu Kassa
(74) *Attorney, Agent, or Firm* — Jefferson IP Law, LLP

(57) ABSTRACT

The present invention relates to a device for gain control and a method for receiving a signal. The device for gain control according to the present invention includes a map interpreter that detects beamforming symbol periods in wireless signals, a power calculator that calculate the average power of the beamforming symbol periods in response to outputs of the map interpreter, a gain calculator that calculates gain control signals on the basis of the output signals of the power calculator, and a switch that outputs gains from the gain control signals, in which the wireless signals are corrected on the basis of the gains.

7 Claims, 4 Drawing Sheets

DEVICE FOR GAIN CONTROL AND METHOD FOR RECEIVING SIGNAL

CROSS-REFERENCE TO RELATED APPLICATION

This application claims priority to and the benefit of Korean Patent Application Nos. 10-2008-0122731 and 10-2009-0025586 filed in the Korean Intellectual Property Office on Dec. 4, 2008 and Mar. 25, 2009, the entire contents of which are incorporated herein by reference.

BACKGROUND OF THE INVENTION (a) Field of the Invention

The present invention relates to a device for gain control and a method for receiving a signal.

(b) Description of the Related Art

In general, a receiving apparatus of a wireless communication system amplifies a received wireless signal with a predetermined gain. In this operation, when the gain is set so large that it departs from the operational range of an analog-to-digital converter (A/D converter), the signal is distorted in the digital region, or when the gain is set too small, quantization noise increases and demodulation performance is deteriorated. Therefore, automatic gain control, which maintains an output signal at a predetermined level even if an input signal changes, is required. The automatic gain control controls a gain, for example, by deriving a control signal on the basis of the power of a preamble.

On the other hand, a beam that is a wireless signal with directionality of a wireless communication system may be formed to radiate an electric wave only in a predetermined desired direction in an antenna. However, a beamforming symbol and a non-beamforming symbol simultaneously exist in one frame, and a power difference is generated between the beamforming symbol and the non-beamforming symbol according to the beamforming performance and channel environment. Controlling a gain on the basis of only the power of the preamble does not consider the power of the beamforming symbol, such that it is difficult to perform accurate gain control. Therefore, specific gain control considering the power of the beamforming symbol is required when a beamforming symbol and a non-beamforming symbol simultaneously exist.

Further, a multiple input multiple output (MIMO) antenna has been recently used in wireless communication systems for high speed communication, in which specific gain control for a wireless signal received by the MIMO antenna is required.

The above information disclosed in this Background section is only for enhancement of understanding of the background of the invention and therefore it may contain information that does not form the prior art that is already known in this country to a person of ordinary skill in the art.

SUMMARY OF THE INVENTION

The technical object of the present invention is to perform accurate and quick gain control when beamforming symbols and non-beamforming symbols simultaneously exist in one frame in a wireless communication system using multiple antennas.

A device for gain control according to an exemplary embodiment of the present invention includes: a map interpreter that detects beamforming symbol periods in wireless signals; a power calculator that calculate average power of the beamforming symbol periods in response to outputs of the map interpreter; a gain calculator that calculates gain control signals on the basis of the output signals of the power calculator; and a switch that outputs gains from the gain control signals, in which the wireless signals are corrected on the basis of the gains.

The device for gain control may further include a multiplier that corrects the wireless signals by multiplying the wireless signals by the gains.

The device for gain control may further include a memory that stores the gain control signals derived on the basis of the wireless signals of a current frame and then transmits the gain control signals to the switch at the next frame.

The average power of the beamforming symbols may be the average power of pilot subcarriers of the beamforming symbols.

The switch may set the gain control signals for the gains in the beamforming symbol periods, and may set 1 in periods other than the beamforming symbol periods.

A method for receiving a signal of a wireless communication system according to another exemplary embodiment of the present invention includes: amplifying received wireless signals by controlling first gains in response to first gain control signals of a previous frame; converting the amplified signals into digital signals; deriving first gain control signals of the current frame in consideration of the average power of reference signals of the digital signals; converting the digital signals into signals of a frequency domain; deriving second gains of the current frame in consideration of the average power of beamforming symbols in the signals of the frequency domain; and correcting the signals of the frequency domain according to the second gains of the previous frame.

The signals of the frequency domain in the beamforming symbol periods may be corrected by the second gains.

The deriving of the second gain control signals may include: detecting the beamforming symbol periods; calculating the average power of the beamforming symbol periods; deriving second gain control signals on the basis of the average power of the beamforming symbols; and outputting second gains composed of combinations of the second gain control signals and 1.

The average power of the beamforming symbol periods may be the average power of pilot subcarriers of the beamforming symbols.

The second gain signals may be derived on the basis of a difference between the largest value of the average power of beamforming symbols of wireless signals received by a plurality of antennas and a reference value, in the deriving of second gain control signals.

In the method for receiving a signal, the second gain control signals may be derived on the basis of a difference between the average value of the average power of beamforming symbols of wireless signals received by a plurality of antennas and a reference value, in the deriving of second gain signals.

According to the present invention, it is possible to perform accurate and quick gain control when beamforming symbols and non-beamforming symbols simultaneously exist in one frame in a wireless communication system using multiple antennas.

DETAILED DESCRIPTION OF THE EMBODIMENTS

Figure 1:
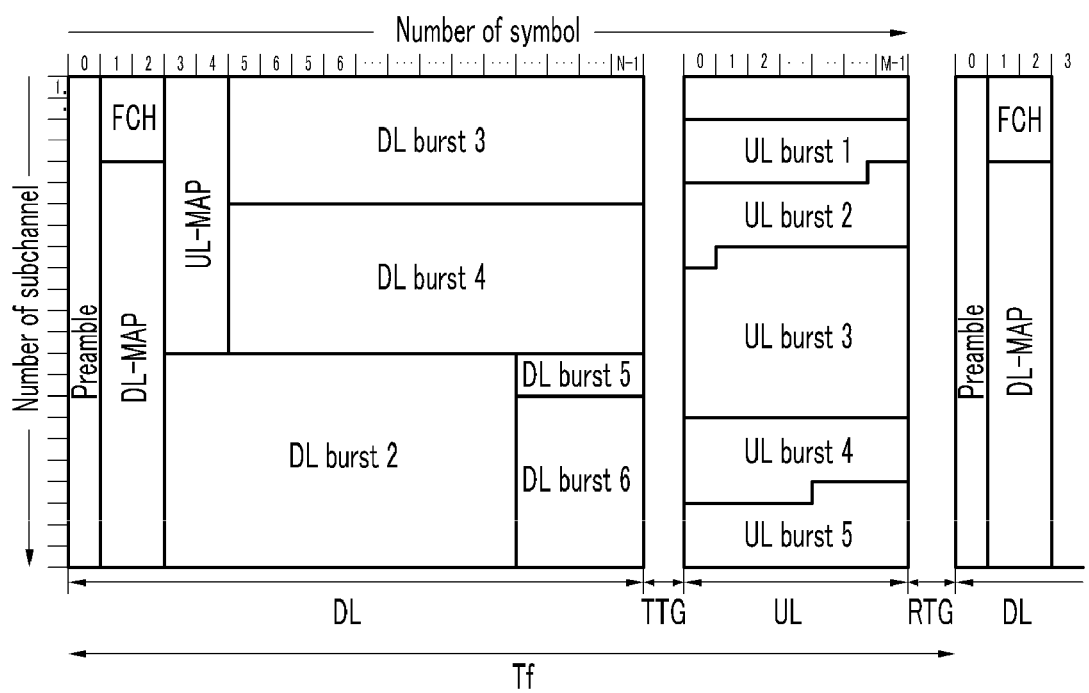
FIG. 1 is a diagram illustrating an example of the frame structure of a wireless signal that a signal receiving apparatus receives, according to an exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout the specification, in addition, unless explicitly described to the contrary, the word "comprise" and variations such as "comprises" or "comprising" will be understood to imply the inclusion of stated elements but not the exclusion of any other elements.

In the specification, a mobile station (MS) may designate a terminal, a mobile terminal (MT), a subscriber station (SS), a portable subscriber station (PSS), user equipment (UE), an access terminal (AT), etc., and may include the entire or partial functions of the terminal, the mobile terminal, the subscriber station, the portable subscriber station, the user equipment, the access terminal, etc.

In the specification, a base station (BS) may designate an access point (AP), a radio access station (RAS), a node B, an evolved node B (eNodeB), a base transceiver station (BTS), a mobile multihop relay (MMR)-BS, etc., and may include the entire or partial functions of the access point, the radio access station, the node B, the enode B, the base transceiver station, the MMR-BS, etc.

A signal receiving apparatus and a method of receiving a signal according to an exemplary embodiment of the present invention are described herein in detail with reference to the accompanying drawings.

Figure 2:
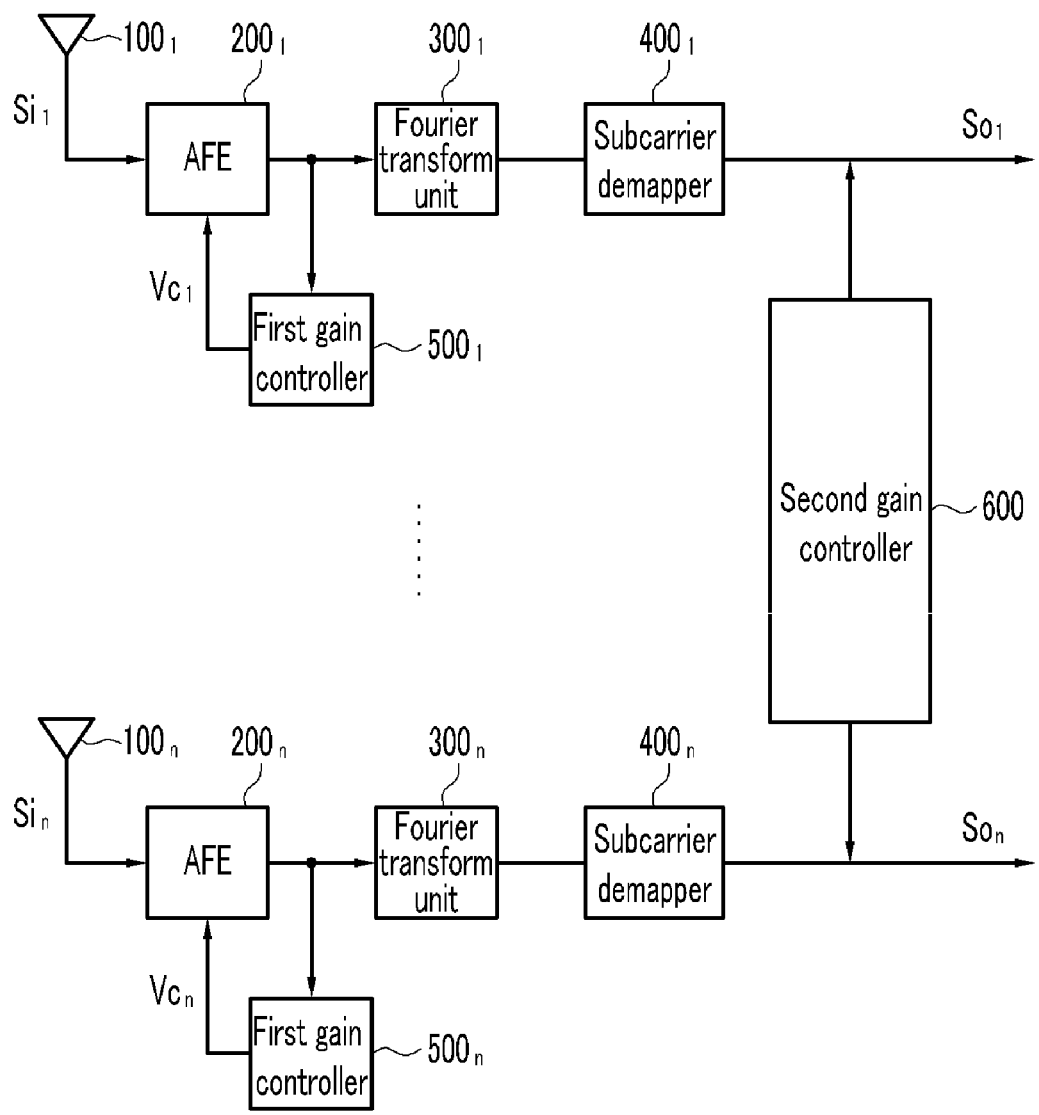
FIG. 2 is a block diagram of a signal receiving apparatus according to an exemplary embodiment of the present invention.

FIG. 1 is a diagram illustrating an example of the frame structure of a wireless signal that a signal receiving apparatus receives, according to an exemplary embodiment of the present invention, and FIG. 2 is a block diagram of a signal receiving apparatus according to an exemplary embodiment of the present invention.

Referring to FIG. 1, in a wireless communication system according to an exemplary embodiment of the present invention, one frame Tf of a wireless signal includes a downlink period DL and an uplink period UL for bidirectional communication. The downlink period DL and the uplink period UL may be separated with a transmit/receive transition gap TTG and a receive/transmit transition gap RTG therebetween.

The downlink period DL may include a preamble, a frame control header FCH, a downlink map DL-MAP, an uplink map UL-MAP, and downlink bursts DL burst1, DL burst2, DL burst3, DL burst4, DL burst5, and DL burst6. The uplink period UL may include a ranging subchannel and uplink bursts UL burst1, UL burst2, UL burst3, UL burst4, and UL burst5.

Information about the downlink bursts DL burst1-6 is included in the downlink map DL-MAP, and information about the uplink bursts UL burst1-5 is included in the uplink map UL-MAP.

Each of the bursts DL burst1-6 and UL burst1-5 include a plurality of symbols that constitute the actual data of a wireless signal.

When a MIMO antenna is used, a specific technology of multiple input multiple output is applied to each of the bursts DL burst1-6 and UL burst1-5, depending on groups. That is, the symbols of the bursts DL burst1-6 and UL burst1-5 may be provided with a beam or not. Beamforming may be performed for each of the bursts DL burst1-6 and UL burst1-5.

Referring to FIG. 2, a signal receiving apparatus according to an exemplary embodiment of the present invention includes an antenna 100, an analog front end (AFE) 200, a Fourier transform unit 300, a subcarrier demapper 400, and gain controllers 500 and 600.

The antenna 100 receives radio frequency signals ($Si_1, \ldots Si_n$) from a transmitting apparatus of a wireless communication system. The signal receiving apparatus includes n antennas ($100_1, \ldots 100_n$) for multiple input/output.

The analog front end 200 converts and outputs the signals ($Si_1, \ldots Si_n$) transmitted from the antenna 100 into digital signals by filtering, converting, and amplifying the signals. The signal receiving apparatus includes n analog front ends ($200_1, \ldots 200_n$) corresponding to the n antennas ($100_1, \ldots 100_n$).

The Fourier transform unit 300 converts the digital signals outputted from the analog front end 200 into frequency domain signals from time domain signals. The signal receiving apparatus includes n Fourier transform units ($300_1, \ldots 300_n$) corresponding to n antennas ($100_1, \ldots 100_n$).

The subcarrier demapper 400 rearranges the signals transformed to the frequency domain. The signal receiving apparatus includes n subcarrier demappers ($400_1, \ldots 400_n$) corresponding to the n antennas ($100_1, \ldots 100_n$).

The gain controller 500 derives gains ($Vc_1, \ldots Vc_n$) on the basis of the average power of the signals outputted from the analog front end 200 and controls the gains while the analog front end 200 performs amplifying. The signal receiving apparatus includes n gain controllers ($500_1, \ldots 500_n$) corresponding to the n antennas ($100_1, \ldots 100_n$).

The gain controller 600 derives gains ($G_1, \ldots G_n$) on the basis of the average power of the signals outputted from the subcarrier demapper 400, and controls the gains of the output signals ($So_1, \ldots So_n$) of the signal receiving apparatus according to whether beams are formed in the bursts.

The analog front end 200 and the gain controller 500 according to an exemplary embodiment of the present invention are described in detail with reference to FIG. 3.

Figure 3:
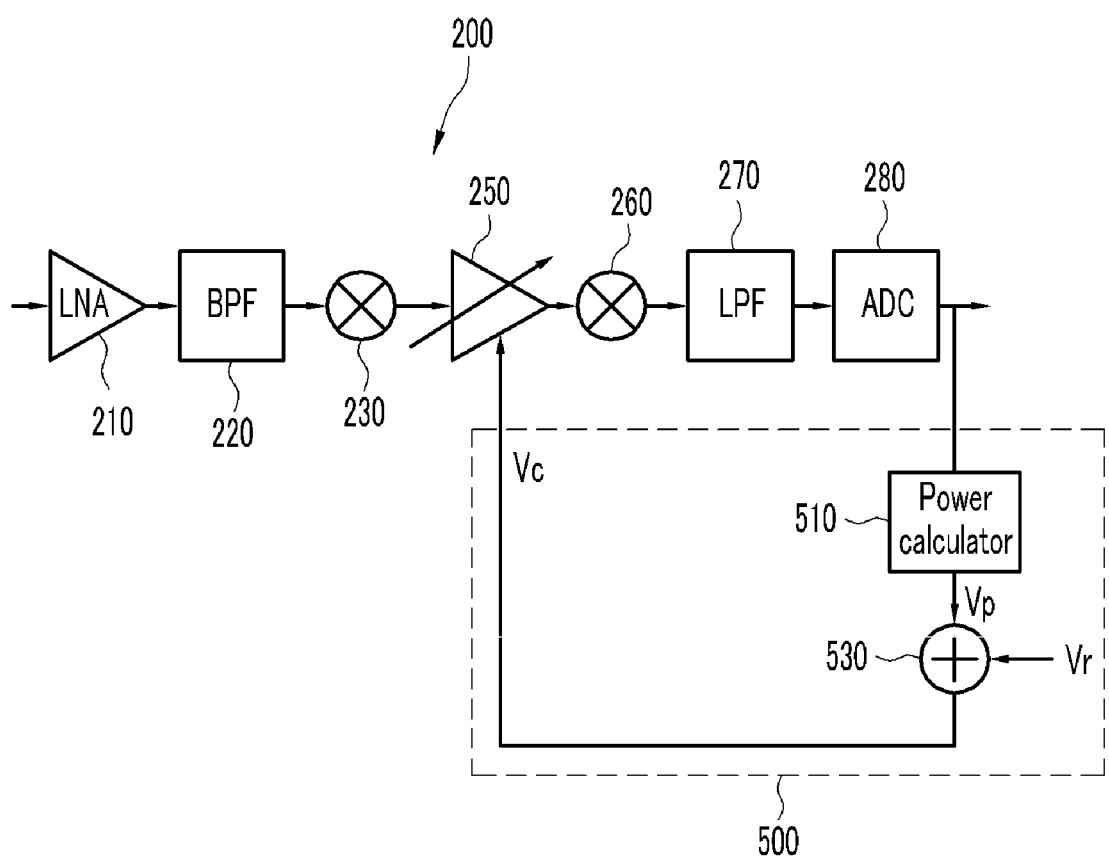
FIG. 3 is a block diagram illustrating an analog front end and a gain controller of a signal receiving apparatus according to an exemplary embodiment of the present invention.

FIG. 3 is a block diagram illustrating the analog front end 200 and the gain controller 500 of the signal receiving apparatus according to an exemplary embodiment of the present invention.

Referring to FIG. 3, the analog front end 200 according to an exemplary embodiment of the present invention includes a low noise amplifier (LNA) 210, a band pass filter (BPF) 220, a frequency converter 230, an amplifier 250, a frequency converter 260, a low pass filter (LPF) 270, and an analog-to-digital converter (A/D converter) 280.

The low noise amplifier 210 amplifies the signals ($Si_1, \ldots Si_n$) transmitted through the antenna 100 while minimizing noise.

The band pass filter 220 selectively passes a frequency of a desired predetermined band from the signals amplified by the low noise amplifier 210.

The frequency converter 230 converts the output signals of the band pass filter 220 from a radio frequency to an intermediate frequency.

The band pass filter 240 selectively passes a frequency of a desired predetermined band from the signals converted to have the intermediate frequency.

The amplifier 250 receives a gain control signal Vc from the gain controller 500, converts the gain in response to the gain control signal Vc, and then amplifies and outputs the output signal of the band pass filter 240 as a signal having a predetermined magnitude on the basis of the converted gain.

The frequency converter 260 converts the signal that is amplified and outputted by the amplifier 250 into a baseband frequency.

The low pass filter 270 passes signals having frequencies that are lower than a predetermined frequency from the output signals of the frequency converter 260.

The analog-to-digital converter (A/D converter) 280 converts the analog output signals of the low pass filter 270 into digital signals.

The gain controller 500 according to an exemplary embodiment of the present invention includes a power calculator 510 and an adder 530.

The power calculator 510 derives a gain control signal Vp on the basis of the average power of the output signals of the analog-to-digital converter (A/D converter) 280, and the average power of the output signals of the analog-to-digital converter (A/D converter) 280 can be obtained from the average power of the preambles.

The adder 530 receives the gain control signal Vp and outputs a difference between the gain control signal Vp and a reference value Vr, and then the output signal is filtered and outputted as a gain Vc.

Figure 4:
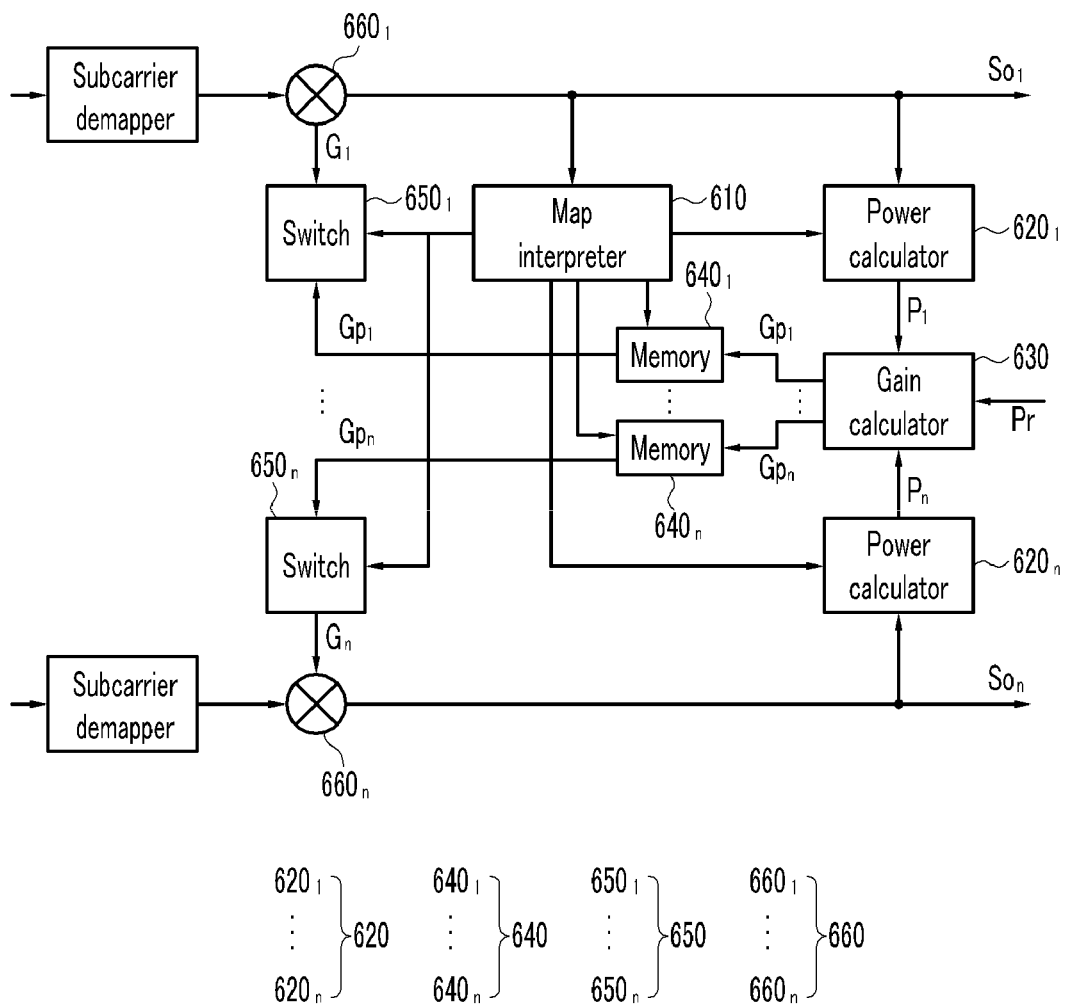
FIG. 4 is a block diagram illustrating another gain controller of a signal receiving apparatus according to an exemplary embodiment of the present invention.

The gain controller 600 of the signal receiving apparatus according to an exemplary embodiment of the present invention is described hereafter in detail with reference to FIG. 4.

FIG. 4 is a block diagram illustrating the gain controller 600 of the signal receiving apparatus according to an exemplary embodiment of the present invention.

Referring to FIG. 4, the gain controller 600 according to an exemplary embodiment of the present invention includes a map interpreter 610, a power calculator 620, a gain calculator 630, a memory 640, a switch 650, and a multiplier 660. The gain controller 600 may include n calculators ($620_1, \ldots 620_n$), n memories ($640_1, \ldots 640_n$), n switches ($650_1, \ldots 650_n$), and n multipliers ($660_1, \ldots 660_n$) corresponding to the n antennas ($100_1, \ldots 100_n$).

The map interpreter 610 receives signals that are rearranged by the subcarrier demapper 400, and interprets the positions of beamforming symbols and non-beamforming symbols in the received frame by analyzing information of the downlink map DL MAP of the received corresponding frame.

The power calculator 620 calculates the average power for the entire period of the beamforming symbols in response to the information on the positions of the beamforming symbols transmitted from the map interpreter 610. It may be possible to calculate the average power of pilot subcarriers instead of the average power of all of the subcarriers, in order to reduce the amount of calculation. All outputs ($P_1, \ldots P_n$) of the n power calculators ($620_1, \ldots 620_n$), that is, the average power of the beamforming symbols calculated for each receiving channel of the antennas ($100_1, \ldots 100_n$), is inputted to the gain calculator 630.

The gain calculator 630 derives gain control signals ($Gp_1, \ldots Gp_n$) from the outputs ($P_1, \ldots P_n$) of the power calculators ($620_1, \ldots 620_n$). The gain calculator 630 can derive the gain control signals ($Gp_1, \ldots Gp_n$) from a difference between the largest value of the outputs ($P_1, \ldots P_n$) of the power calculators ($620_1, \ldots 620_n$) and a reference value Pr, or can derive the gain control signals ($Gp_1, \ldots Gp_n$) from a difference between the average value of the outputs ($P_1, \ldots P_n$) of the power calculators ($620_1, \ldots 620_n$) and the reference value Pr.

The memory 640 receives and stores the gain control signals ($Gp_1, \ldots Gp_n$), and outputs the gain control signals ($Gp_1, \ldots Gp_n$) calculated on the basis of the input frame of the current frame to the beamforming symbol periods of the next frame. The memory 640 operates upon receiving information about the beamforming symbol periods from the map interpreter 610.

The switch 650 outputs gains ($G_1, \ldots G_n$) on the basis of the gain control signals ($Gp_1, \ldots Gp_n$) transmitted from the memory 640. The gains ($G_1, \ldots G_n$) are the same as the gain control signals ($Gp_1, \ldots Gp_n$) in the beamforming symbol periods and are "1" in the other periods. Further, the switch 650 also operates in response to the information about the beamforming symbol periods of the map interpreter 610.

The multiplier 660 outputs output signals ($S_{O1}, \ldots S_{On}$) of the signal receiving apparatus by multiplying the output of the subcarrier demapper 400 of the current frame by the calculated gains ($G_1, \ldots G_n$) calculated in the previous frame.

As described above, the gains of the output signals ($S_{O1}, \ldots S_{On}$) of the signal receiving apparatus are controlled by controlling the gains of amplification in consideration of the average power of the preambles by the gain controller 500 and then correcting the average power of the beamforming symbols by the gain controller 600.

The exemplary embodiments of the present invention are implemented not only the method and apparatus, but also by programs that achieve functions corresponding to the configuration of the exemplary embodiments of the present invention or recording mediums including the programs.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A device for gain control, comprising:
   a map interpreter that detects beamforming symbol periods in wireless signals;
   a power calculator that calculates average power of the beamforming symbol periods in response to outputs of the map interpreter;
   a gain calculator that calculates gain control signals on the basis of the output signals of the power calculator;
   a memory that stores the gain control signals derived on the basis of the wireless signals of a current frame and then transmits the gain control signals to a switch at a next frame, wherein the switch outputs gains from the gain control signals; and;
   a multiplier that corrects the wireless signals by multiplying the wireless signals by the gains.

2. The device for gain control of claim 1, wherein the average power of the beamforming symbols is the average power of pilot subcarriers of the beamforming symbols.

3. The device for gain control of claim 1, wherein the switch sets the gain control signals for the gains in the beamforming symbol periods, and sets 1 as the gain in periods other than the beamforming symbol periods.

4. A method for receiving a signal of a wireless communication system, comprising:

amplifying received wireless signals by controlling first gains in response to first gain control signals of a previous frame;

converting the amplified signals into digital signals;

deriving first gain control signals of the current frame in consideration of the average power of reference signals of the digital signals;

converting the digital signals into signals of a frequency domain;

deriving second gains of the current frame in consideration of the average power of beamforming symbols in the signals of the frequency domain; and correcting the signals of the frequency domain according to the second gains of the previous frame, wherein the signals of the frequency domain in the beamforminq symbol periods are corrected by the second gains, and wherein the deriving of the second gain control signals comprises:

detecting the beamforminq symbol periods;

calculating the average power of the beamforminq symbol periods;

deriving second gain control signals on the basis of the average power of the beamforming symbols; and outputting second gains composed of combinations of the second gain control signals and 1.

5. The method of claim 4, wherein the average power of the beamforming symbol periods is the average power of pilot subcarriers of the beamforming symbols.

6. The method of claim 4, wherein the second gain signals are derived on the basis of a difference between the largest value of the average power of beamforming symbols of wireless signals received by a plurality of antennas and a reference value, in the deriving of second gain control signals.

7. The method of claim 4, wherein the second gain control signals are derived on the basis of a difference between the average value of the average power of beamforming symbols of wireless signals received by a plurality of antennas and a reference value, in the deriving of second gain signals.

* * * * *